United States Patent
Thean et al.

(10) Patent No.: US 7,575,975 B2
(45) Date of Patent: Aug. 18, 2009

(54) METHOD FOR FORMING A PLANAR AND VERTICAL SEMICONDUCTOR STRUCTURE HAVING A STRAINED SEMICONDUCTOR LAYER

(75) Inventors: Voon-Yew Thean, Austin, TX (US); Jian Chen, Austin, TX (US); Bich-Yen Nguyen, Austin, TX (US); Mariam G. Sadaka, Austin, TX (US); Da Zhang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 267 days.

(21) Appl. No.: 11/263,120

(22) Filed: Oct. 31, 2005

(65) Prior Publication Data

US 2007/0099353 A1    May 3, 2007

(51) Int. Cl.
H01L 21/00 (2006.01)
H01L 21/84 (2006.01)
H01L 21/8234 (2006.01)
H01L 27/088 (2006.01)

(52) U.S. Cl. .......... 438/275; 438/154; 438/938; 257/331; 257/365; 257/369; 257/347; 257/204; 257/285; 257/351; 257/401

(58) Field of Classification Search .......... 438/157, 438/275, 285, 283, 176, 154, 938; 257/401, 257/353, E21.442, E21.633, E21.703, E27.112, 257/E29.275, E29.297, 331, 365, 369, 347, 257/204, 351, 285
See application file for complete search history.

(56) References Cited

U.S. PATENT DOCUMENTS 6,483,171 B1 * 11/2002 Forbes et al. ............. 257/627
6,867,433 B2 * 3/2005 Yeo et al. .................. 257/67
6,882,025 B2 * 4/2005 Yeo et al. .................. 257/510
7,052,964 B2 * 5/2006 Yeo et al. .................. 438/296
7,067,370 B2   6/2006 Lee et al.
7,101,742 B2 * 9/2006 Ko et al. .................... 438/197
7,112,495 B2 * 9/2006 Ko et al. .................... 438/300
7,180,134 B2   2/2007 Yang et al.

(Continued)

OTHER PUBLICATIONS

International Search Report.

(Continued)

*Primary Examiner*—David Vu
*Assistant Examiner*—Arman Khosraviani
(74) *Attorney, Agent, or Firm*—Joanna G. Chiu; Robert L. King

(57) ABSTRACT

Forming a semiconductor structure includes providing a substrate having a strained semiconductor layer overlying an insulating layer, providing a first device region for forming a first plurality of devices having a first conductivity type, providing a second device region for forming a second plurality of devices having a second conductivity type, and thickening the strained semiconductor layer in the second device region so that the strained semiconductor layer in the second device region has less strain that the strained semiconductor layer in the first device region. Alternatively, forming a semiconductor structure includes providing a first region having a first conductivity type, forming an insulating layer overlying at least an active area of the first region, anisotropically etching the insulating layer, and after anisotropically etching the insulating layer, depositing a gate electrode material overlying at least a portion of the insulating layer.

17 Claims, 6 Drawing Sheets

U.S. PATENT DOCUMENTS

| | | | |
|---|---|---|---|
| 2003/0040185 | A1 | 2/2003 | Jun |
| 2004/0031979 | A1 | 2/2004 | Lochtefeld et al. |
| 2004/0161886 | A1* | 8/2004 | Forbes et al. .............. 438/198 |
| 2004/0256639 | A1* | 12/2004 | Ouyang et al. .............. 257/202 |
| 2004/0259315 | A1* | 12/2004 | Sakaguchi et al. .......... 438/285 |
| 2004/0266076 | A1* | 12/2004 | Doris et al. ................. 438/157 |
| 2005/0017377 | A1* | 1/2005 | Joshi et al. .................. 257/903 |
| 2005/0167652 | A1 | 8/2005 | Hoffmann et al. |
| 2005/0167750 | A1* | 8/2005 | Yang et al. .................. 257/347 |
| 2005/0218427 | A1* | 10/2005 | Joshi et al. .................. 257/192 |
| 2005/0224897 | A1 | 10/2005 | Chen et al. |
| 2005/0227498 | A1* | 10/2005 | Furukawa et al. ........... 438/758 |
| 2005/0263831 | A1* | 12/2005 | Doris et al. .................. 257/401 |
| 2005/0280121 | A1* | 12/2005 | Doris et al. .................. 257/629 |
| 2006/0011984 | A1* | 1/2006 | Currie ......................... 257/352 |
| 2006/0014366 | A1* | 1/2006 | Currie ......................... 438/517 |
| 2006/0113603 | A1* | 6/2006 | Currie ......................... 257/368 |
| 2006/0113605 | A1* | 6/2006 | Currie ......................... 257/368 |
| 2006/0157687 | A1* | 7/2006 | Doyle et al. ................... 257/19 |
| 2006/0180866 | A1* | 8/2006 | Zhu et al. .................... 257/368 |
| 2006/0214226 | A1* | 9/2006 | Chen et al. ................... 257/347 |
| 2007/0052041 | A1* | 3/2007 | Sorada et al. ................ 257/392 |

OTHER PUBLICATIONS

Monfray et al., "50nm-Gate All Around (GAA)—Silicon On Nothing (SON)—Devices: A Simple Way to Co-Integration of GAA Transistors Within Bulk MOSFET Process," IEEE 2002 Symposium On VLSI Technology Digest Technical Papers, pp. 108-109.

Borland, "Novel Device Structures by Selective Epitaxial Growth (SEG)," IEEE, 4 pgs. (1987).

Terada et al, "A New Dram Cell with a Transistor on a Lateral Epitaxial Silicon Layer (TOLE Cell)," IEEE Transactions on Electron Devices, vol. 27, No. 9, Sep. 1990, pp. 2052-2057.

Terada et al., "A CMOS/Partial-SOI Structure for Future ULSIs," IEEE SOS/SOT Technology Workshop, p. 37 (1988).

Monfray et al., "SON (Silicon-On-Nothing) P-MOSFETs With Totally Silicided ($CoSi_2$) Polysilicon on 5nm-thick Si-films: The Simplest Way to Integration of Metal Gates on Thin FD Channels," IEEE, p. 263-266 (2002).

Monfray et al., "Highly-performant 38nm SON (Silicon-On-Nothing) P-MOSFETS With 9nm-thick Channels," 2002 IEEE International SOI Conference, pp. 20-22.

Monfray et al., "First 80nm SON (Silicon-On-Nothing MOSFETS With Perfect Morphology and High Electrical Performance," IEEE, pp. 29.7.1-29.7.4 (2001).

Jurczak et al., "Silicon-on-Nothing (SON)—an Innovative Process for Advanced CMOS," IEEE Transactions on Electron Devices, vol. 47, No. 11, Nov. 2000, pp. 2179-2187.

Burghartz et al., "Partial-SOI Isolation Structure for Reduced Bipolar Transistor Parasitics," IEEE Electron Device Letters, vol. 13, No. 8, Aug. 1992, pp. 424-425.

Kubota et al., "A New Soft-Error Immune Dram Cell With A Transistor On A Lateral Epitaxial Silicon Layer (TOLE Cell)," IEEE, 4 pgs. (1987).

Ogura, "Partial SOI/SON Formation by He+ Implantation and Annealing," 2002 IEEE International SOI Conference, pp. 185-186.

* cited by examiner

METHOD FOR FORMING A PLANAR AND VERTICAL SEMICONDUCTOR STRUCTURE HAVING A STRAINED SEMICONDUCTOR LAYER

RELATED APPLICATION

This is related to U.S. Application entitled "Method for Forming a Semiconductor Structure and Structure Thereof," by Aaron Thean et al., having U.S. patent application Ser. No. 11/263,119 filed on even date, and assigned to the current assignee hereof.

FIELD OF THE INVENTION

The present invention relates generally to semiconductor processing, and more specifically, to a semiconductor structure having different device regions.

RELATED ART

As technology advances in semiconductor processing, devices are being continuously scaled down in size. However, as the sizes of devices are scaled down, mobility within these devices typically degrades due, for example, to the increased channel doping needed to control leakage current. In order to improve mobility which is degraded due to the scaling of devices, the silicon in which the devices are formed may be strained. For example, for n-type devices, the silicon may be tensile strained to improve mobility, while for p-type devices, the silicon may be compressively strained to improve mobility. It should be noted that the particular straining of the silicon affects performance of the devices where, depending on the straining applied, performance of one type of device may be better than performance of the other type of device. Also, the crystal orientation of the surface and the crystal direction of the channel used for processing devices also affect device performance where the particular crystal orientation and direction may favor one type of device over another.

For CMOS (Complimentary Metal Oxide Semiconductor) circuits, both n-type devices, i.e. NMOS (N-type Metal Oxide Semiconductor) devices, and p-type devices, i.e. PMOS (P-type Metal Oxide Semiconductor) device, are needed. However, when integrating these different types of devices, the performance of one type of device may be sacrificed because the processing favors the other type of device. Therefore, it is desirable to be able to integrate these different types of devices on a same substrate while achieving high performance for both types of devices.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

As discussed above, when forming CMOS circuits, both n-type and p-type devices need to be integrated on a same substrate. In one embodiment, a biaxially tensile strained semiconductor layer having a surface crystal orientation of (100) is used to form both n-type and p-type devices. In one embodiment, the n-type device is formed as a planar or horizontal device, such that the (100) crystal orientation may allow for improved performance of the n-type device. In one embodiment, the p-type device is formed as a vertical device, such as, for example, a FinFET (Fin Field Effect Transistor). When formed as a vertical device, the crystal orientation of the surface in which the channel is formed becomes (110) which allows for improved performance of the p-type devices. However, in order to allow for improved performance of the p-type devices formed using the biaxially tensile strained semiconductor layer, the intrinsic tension within the biaxially tensile strained semiconductor layer is relaxed such that the intrinsic tension is partially or fully removed.

In one embodiment, in order to relax the strain, the biaxially tensile strained semiconductor layer is thickened in those regions where p-type devices are to be formed. As a result, the semiconductor layer in the regions where vertical p-type devices will be formed will become less tensile strained as compared to the regions where planar n-type devices will be formed. In one embodiment, the semiconductor layer in the regions where p-type devices will be formed becomes relaxed such that no intrinsic strain remains present. Alternatively, this semiconductor layer in these regions may become only partially relaxed. After thickening of the semiconductor layer, the vertical p-type device may then be formed. Therefore, both n-type and p-type devices may be integrated using a same strained semiconductor layer, while maintaining improved performance for both types of devices.

Figure 1:
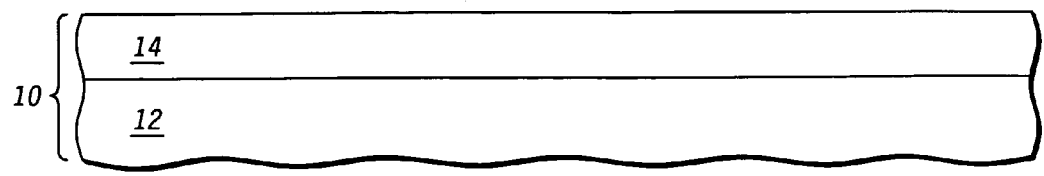
FIGS. 1-11 illustrate cross sectional views of various processing steps used to form planar device and a vertical device in accordance with one embodiment of the present invention.

FIG. 1 illustrates a substrate 10 having an insulating layer 12 and a strained semiconductor layer 14 overlying insulating layer 12. In one embodiment, substrate 10 may be provided as a strained semiconductor on insulator (SSOI) where semiconductor layer 14 may include, for example, strained silicon, strained germanium, strained silicon germanium, strained silicon germanium carbon alloy, strained silicon carbide, strained carbon-doped silicon, other strained semiconductor materials, or combinations thereof. (Substrate 10 may also be referred to as a strained semiconductor directly on insulator (SSDOI) where semiconductor layer 14 is directly on insulating layer 12.) In one embodiment, strained semiconductor layer 14 is a biaxially tensile strained semiconductor layer. In one embodiment, strained semiconductor layer 14 has an in-plane biaxial tensile stress in range of approximately 1.0 to 1.5 Giga Pascals (GPa), which corresponds to approximately 0.5-0.8% strain. In one embodiment, strained semiconductor layer 14 has an in-plane biaxial tensile stress of greater than approximately 1.0 GPa. Also, in one embodiment, strained semiconductor layer 14 may have a thickness in a range of approximately 20 to 60 nanometers. In one embodiment, strained semiconductor layer 14 may have any thickness so long as it is strain stable where the strain is thermally and mechanically stable such that, for example, it can sustain thermal cycling during subsequent relaxation processing, as will be described in more detail below.

In one embodiment, insulating layer 12 may include an oxide. Alternatively, other insulating layer 12 may include other insulating materials, such as, for example, lanthanum aluminate, hafnium oxide, nitride, any dielectrics with a low dielectric constant (K) (where a low K, refers to a K of less than that of silicon dioxide), or combinations thereof. In yet another embodiment, substrate 10 may not include insulating layer 12.

Substrate 10 includes a first device region 18 for forming devices having a first conductivity type and a second device region 20 for forming devices having a second conductivity type. In one embodiment, region 18 corresponds to an n-type region where n-type devices or n-channel devices will be formed, and region 20 corresponds to a p-type region where p-type devices or p-channel devices will be formed, as will be described in reference to FIGS. 3-13. Note that each of regions 18 and 20 may either be contiguous or non-contiguous regions. Also, note that substrate 10 may include any number of regions, as needed, for different types of devices. For example, substrate 10 may include multiple n-type regions and multiple p-type regions. In one embodiment, region 18 may also be referred to as an n-type region and region 20 may also be referred to as a p-type region.

Figure 2:
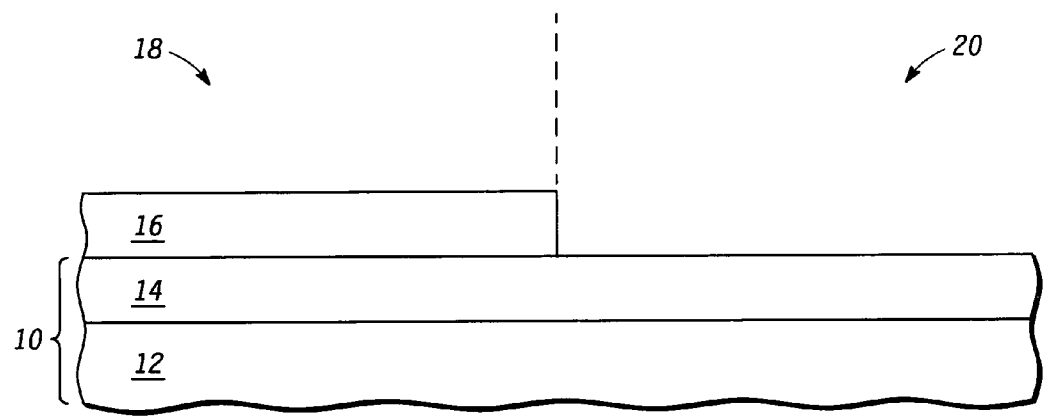

FIG. 2 illustrates substrate 10 after the formation of a patterned masking layer 16 over strained semiconductor layer 14 in region 18, exposing strained semiconductor layer 14 in region 20. In one embodiment, patterned masking layer 16 is a hard mask including, for example, a nitride, and may be formed and patterned according to conventional processing steps.

Figure 3:
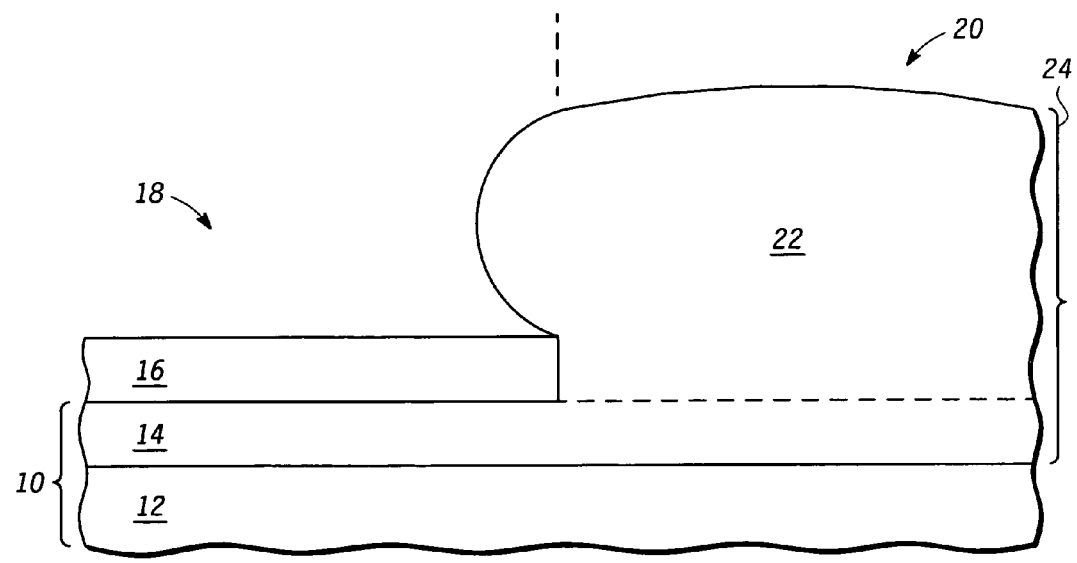

FIG. 3 illustrates substrate 10 after growing a semiconductor layer 22 over exposed surfaces of strained semiconductor layer 14 in region 20 in order to relax strained semiconductor layer 14 in region 20. In one embodiment, grown semiconductor layer 22 is selectively epitaxially grown. In one embodiment, grown semiconductor layer 22 is grown to a thickness greater than the thickness of patterned masking layer 16. Alternatively, patterned masking layer 16 may be thicker than grown semiconductor layer 22. Grown semiconductor layer 22 may include, for example, silicon, germanium, silicon germanium, silicon germanium carbon, silicon carbide, other III-V or II-VI semiconductor compounds, or combinations there of. In one embodiment, where strained semiconductor layer 14 is a strained silicon layer, semiconductor layer 22 may be epitaxially grown silicon. In one embodiment, semiconductor layer 22 is grown at a temperature in a range of approximately 400 to 950 degrees Celsius, or more preferably, in a range of approximately 800 to 900 degrees Celsius. (Note that generally, a higher temperature for growing allows for more relaxation of the strained semiconductor.) Note that semiconductor layer 14 and grown semiconductor layer 20 may also be formed of different materials. For example, if semiconductor layer 14 is silicon, grown semiconductor layer 22 may be formed of any of the materials listed above for grown semiconductor layer 22. As illustrated in FIG. 3, the combination of semiconductor layer 14 in region 20 and grown semiconductor layer 22 may be referred to as semiconductor layer 24.

As a result, the portion or portions of semiconductor layer 14 within region 20 are thickened as compared to the portion or portions of semiconductor layer 14 within region 18. In one embodiment, the thickness of semiconductor layer 24 is in a range of approximately 40 to 100 nanometers. Alternatively, semiconductor layer 24 may have a thickness of greater than approximately 100 nanometers. Note that, in one embodiment, the use of patterned masking layer 16 in region 18 prevents thickening of strained semiconductor layer 14 in region 18 while allowing thickening of strained semiconductor layer 14 in region 20.

Also, when semiconductor layer 22 is grown, the tensile strain of semiconductor layer 14 within region 20 is relaxed. After formation of grown semiconductor layer 22, a thermal treatment with reactive ambient gases is performed to further relax the residual strain in semiconductor layer 24. In one embodiment, the thermal treatment is performed at a temperature in a range of approximately 400 to 1200 degrees Celsius, or, more preferably, in a range of approximately 900 to 1100 degrees Celsius for 15-30 minutes under pressure exceeding 200 milli Torr. The reactive ambient gas may include, for example, hydrogen chloride or hydrogen.

In one embodiment, after the thermal treatment, the tensile strain is fully removed such that resulting semiconductor layer 24 is relaxed, having a stress of approximately 0 GPa. In one embodiment, the tensile stress is substantially removed. Alternatively, the tensile stress is at least partially removed. Patterned masking layer 16 within region 18 of substrate 10 protects strained semiconductor layer 14 such that the portion or portions of semiconductor layer 14 that are within region 18 remain tensile strained. Therefore, semiconductor layer 24 in region 20 has less tensile strain than strained semiconductor layer 14 in region 18. As described above, in one embodiment, the thickness of semiconductor layer 14 is initially selected such that it is strain stable so that it may remain tensile stressed even after the thermal treatment described above used to create relaxed semiconductor layer 24.

Figure 4:
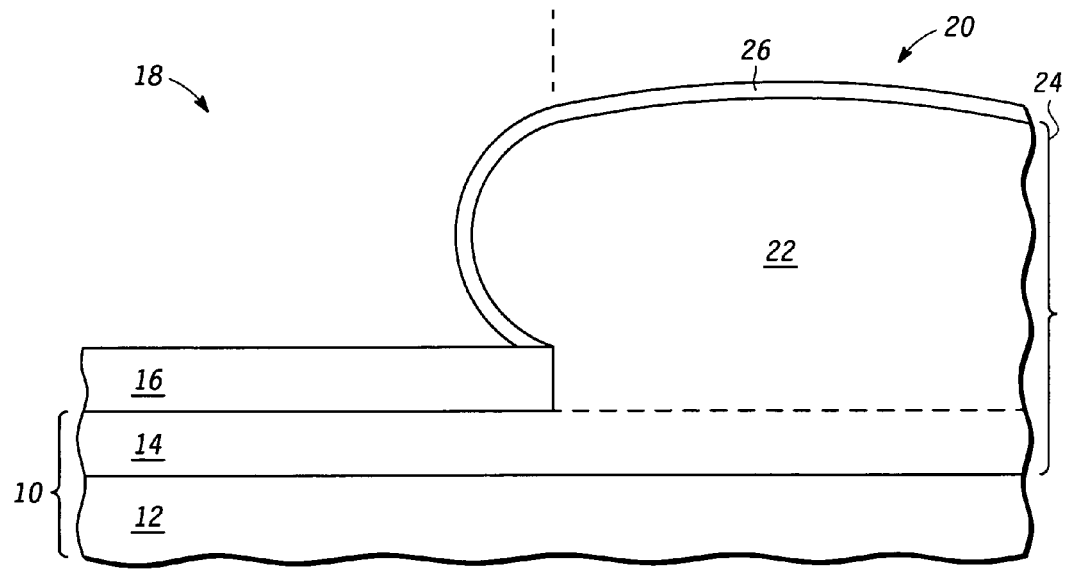

FIG. 4 illustrates substrate 10 after oxidation to form an oxide layer 26 over grown semiconductor layer 22. Conventional oxidation processes may be used to form oxide layer 26. After formation of oxide layer 26, patterned masking layer 16 is removed. For example, in one embodiment where patterned masking layer 16 is a patterned nitride hard mask, a wet etch using, for example, hot phosphoric acid, may be used to remove the mask. Alternatively, in this example, a dry etch may be used. In alternate embodiments, other insulating layers including other insulating materials may be used in place of oxide layer 26.

Figure 5:
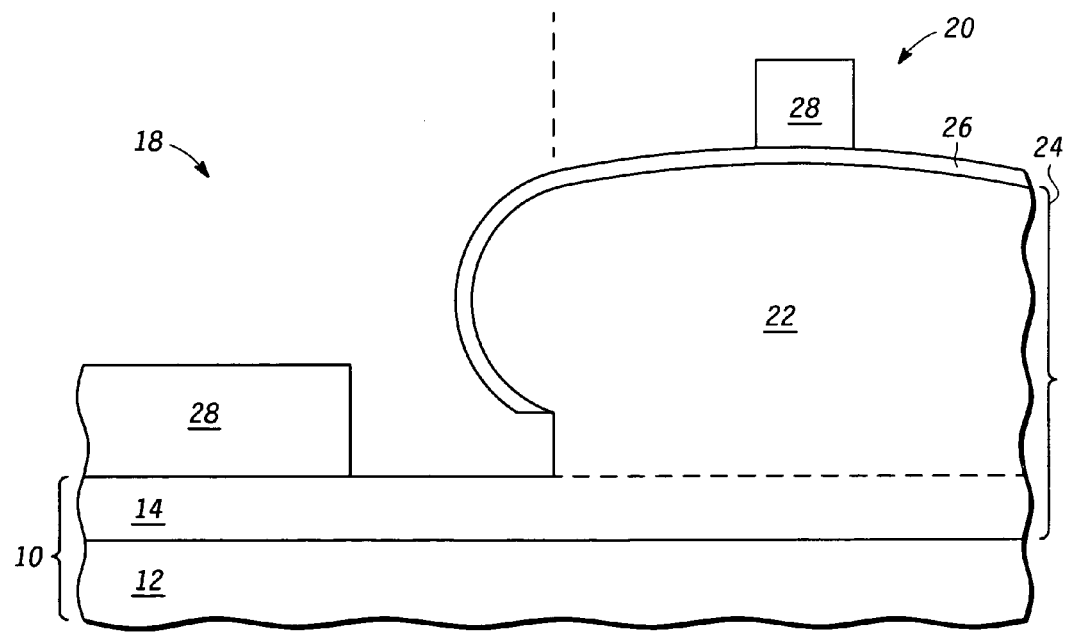

FIG. 5 illustrates substrate 10 after removal of patterned masking layer 16 and after formation of a patterned masking layer 28. Patterned masking layer 28 may include photoresist, or alternatively, may be a hard mask, and may be formed and patterned using conventional processes and materials. Patterned masking layer 28 defines active regions in region 18 and fin structures in region 20.

Figure 6:
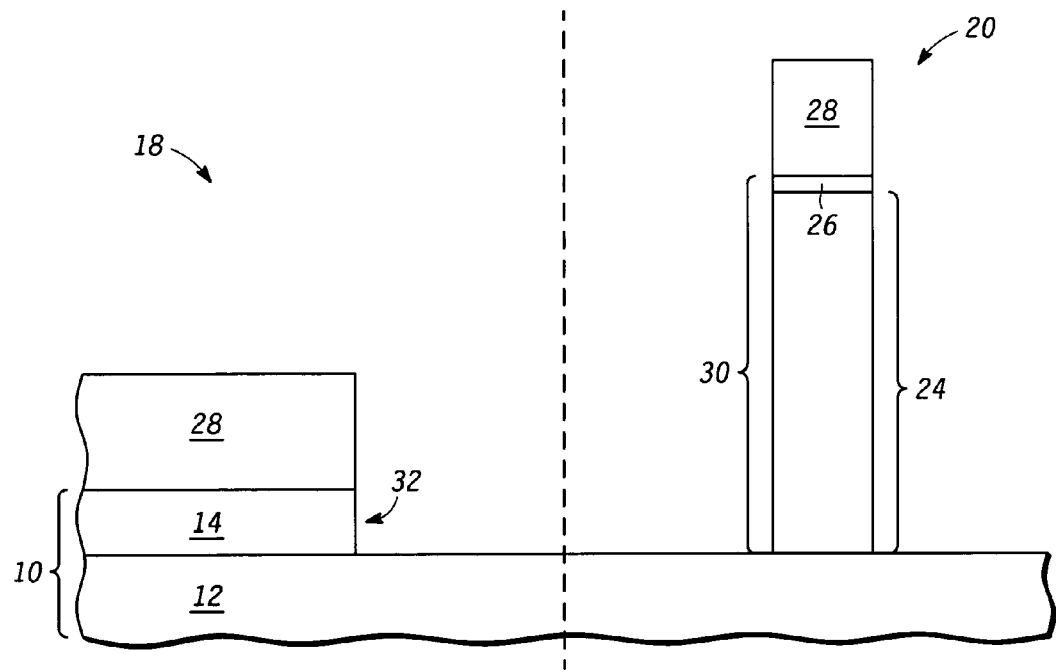

FIG. 6 illustrates substrate 10 after removal of portions of semiconductor layer 14 and grown semiconductor layer 22 using patterned masking layer 28, resulting in active region 32 within region 18 and fin structure 30 in region 20. Active region 32 corresponds to an active region in which planar devices will be formed (and may also be referred to as active area 32). In one embodiment, active region 32 corresponds to an active region in which planar n-type devices will be formed, and may, therefore, also be referred to as an n-type active region. Note that region 18 may include any number of active regions such as active region 32, as needed, where each of the active regions is formed of a tensile strained semiconductor material. Therefore, subsequently formed n-type devices in these active regions will have improved carrier mobility due to the tensile strained semiconductor material. Fin structure 30 corresponds to the fin portion of a p-type FinFET device. Note that in alternate embodiments, fin structure 30 may instead correspond to a vertical gate structure of, for example, a vertical single or double gate device. Region 20 may include any number of fin structures for p-type devices, where region 20 may include a combination of devices such as both FinFET and vertical double gate devices.

Figure 7:
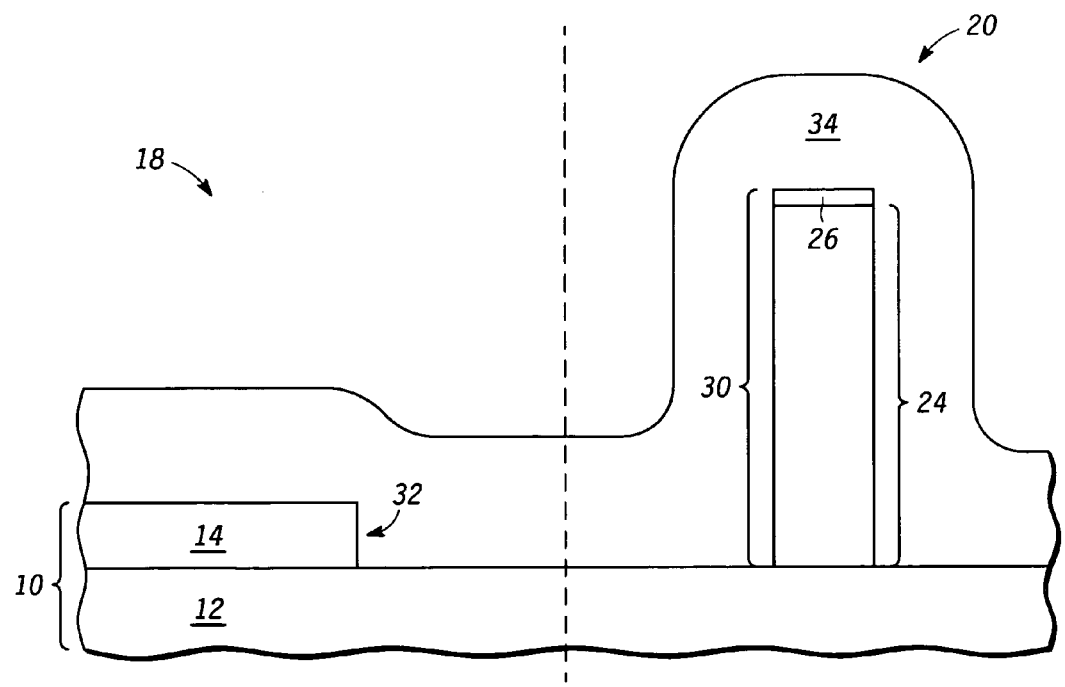

FIG. 7 illustrates substrate 10 after removal of patterned masking layer 28 and the subsequent formation of an insulating layer 34 overlying active area 32 and fin structure 30. Patterned masking layer 28 may be removed using conventional processing. Insulating layer 34 will be used to form active area spacers adjacent sidewalls of active region 32, as will be described further below. Insulating layer 34 may include, for example, an oxide, a nitride, an oxynitride, a high-K material (a material having a K higher than silicon dioxide), a low-K material, a material having a K equal to silicon dioxide, or combinations thereof. For example, in one embodiment, insulating layer 34 may include silicon dioxide. Also, note that insulating layer 34 may include any number of layers having different insulating materials.

Figure 8:
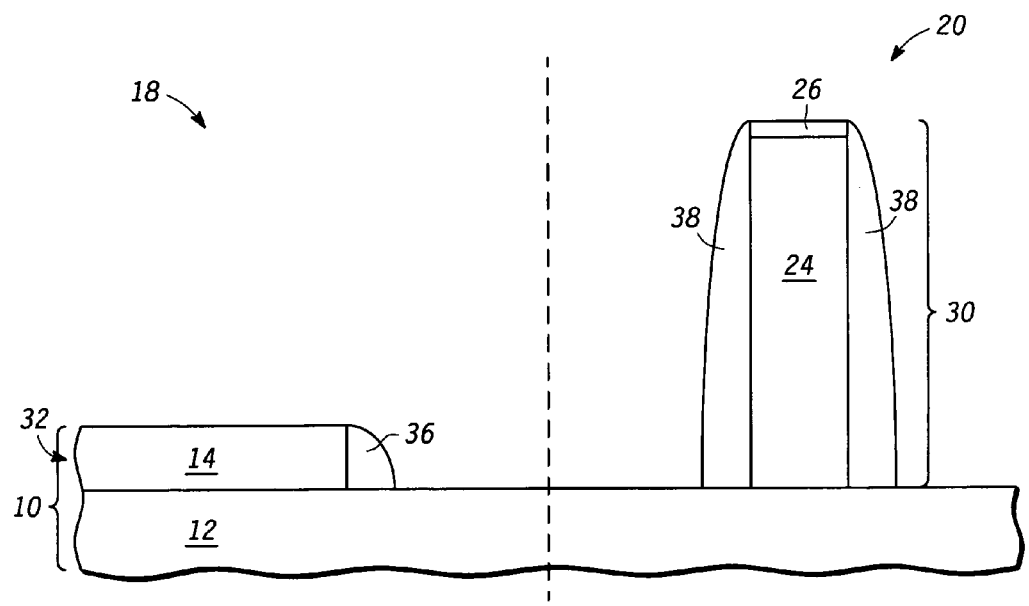

FIG. 8 illustrates substrate 10 after anisotropically etching insulating layer 34, resulting in active region sidewall spacer 36 in region 18 and spacers 38 in region 20. Active region sidewall spacer 36 is adjacent a sidewall of active region 32. In the illustrated embodiment, active region sidewall spacer 36 is also adjacent insulating layer 12. Also, note that active region sidewall spacer surrounds active region 32. In one embodiment, active region sidewall spacer 36 isolates active region 32 from other devices, such as, for example, from the vertical device being formed with fin 30. However, active region sidewall spacers 36 may be used to isolate active region 32 from any other neighboring devices, including other planar devices, other vertical devices, or any combination of devices. Note that region 18 may include any number of active regions within region 18 and each active region would include a surrounding active region sidewall spacer such as spacer 36. Also, since insulating layer 34 may include any number of layers having different insulating materials, note that resulting active region sidewall spacers 36 may also include any number of layers having different insulating materials.

Figure 9:
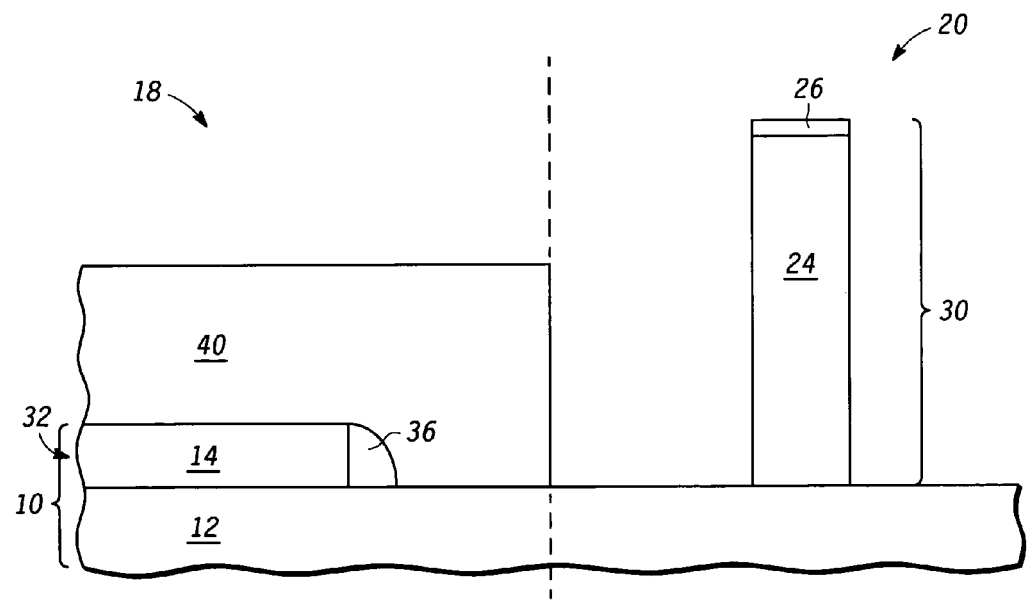

FIG. 9 illustrates substrate 10 after formation of a patterned masking layer 40 which protects region 18 while exposing the fin structures of region 20. Patterned masking layer 40, in one embodiment, is a photoresist mask which may be formed using conventional processing. After formation of patterned masking layer 40, spacers 38 adjacent fin structure 30 are removed. For example, in one embodiment, an isotropic etch may be performed to remove spacers 38. Note that the spacers from all fin structures in region 20, exposed by patterned masking layer 40, would be removed, as illustrated with respect to fin structure 30. Therefore, patterned masking layer 40 allows for the removal of spacers (such as spacers 38) adjacent fin structures in region 20 while protecting active region sidewall spacers (such as active region sidewall spacer 36) in region 18. After removal of spacers 38, patterned masking layer 40 is removed. Conventional processing may be used to remove patterned masking layer 40.

Figure 10:
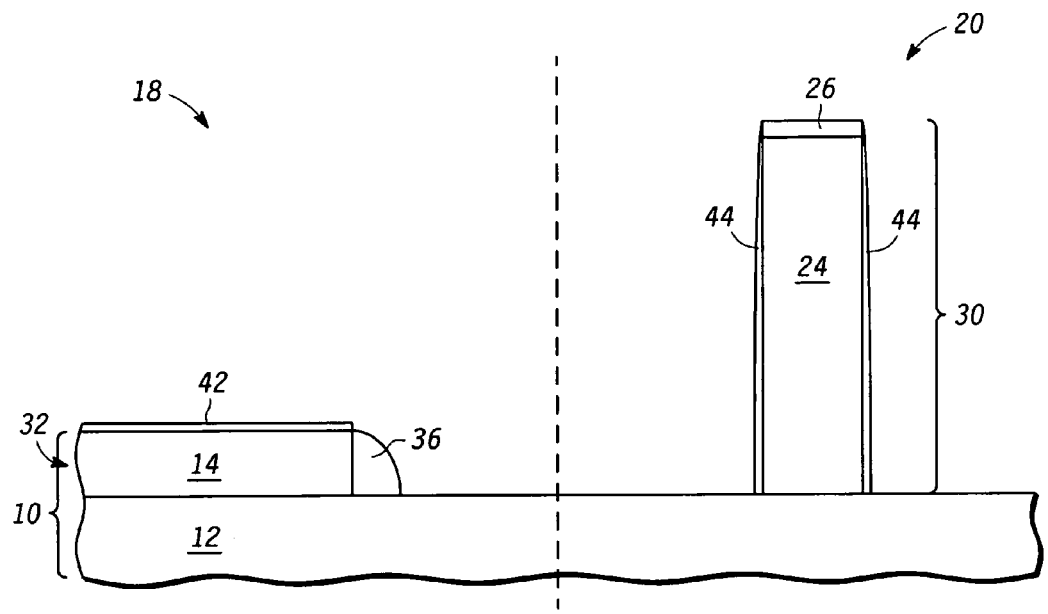

FIG. 10 illustrates substrate 10 after removal of patterned masking layer 40 and subsequent formation of gate dielectric layers 42 and 44. In one embodiment, gate dielectric layers 42 and 44 are oxides that are grown on active area 32 and the along the top and sides of fin structure 30. Alternatively, gate dielectric layers 42 and 44 may be high-K dielectric materials, such as, for example, hafnium oxide, hafnium silicate, and other hafnium compounds. Alternatively, other high-K dielectric materials may be used. In this embodiment, though, the gate dielectric layer 42 would be deposited over active area 32, spacer 36, insulating layer 12, and fin structure 30. Alternatively, gate dielectric layers 42 and 44 may be of different material composition and/or thicknesses.

In one embodiment, after removal of patterned masking layer 40 and prior to the formation of gate dielectric layers 42 and 44, body doping may be performed. In one embodiment, region 20 is masked while performing body doping for the well implants into active region 32, and then region 18 is masked while performing body doping on fin structure 30. Note that conventional processing and doping techniques may be used to perform the body doping.

Figure 11:
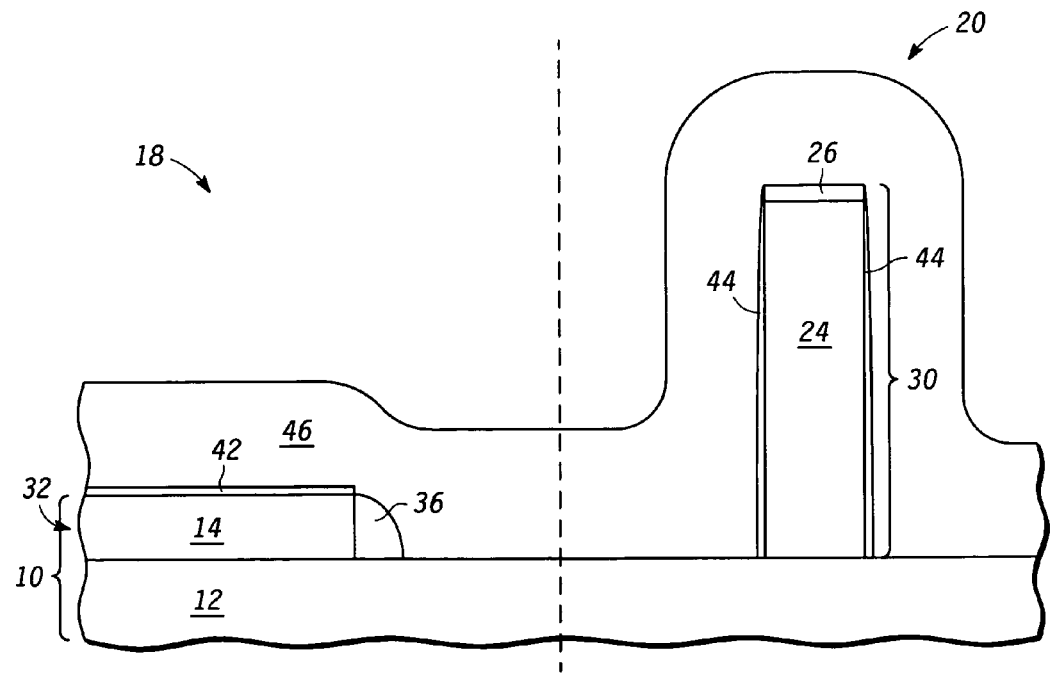

FIG. 11 illustrates substrate 10 after formation of a patterned gate electrode layer 46 overlying active region 32, active region sidewall spacer 36, and fin structure 30. Patterned gate electrode layer 46 may be formed by forming a gate electrode material over substrate 10 (over active region 32, active region sidewall spacer 36, and fin structure 30) and subsequently patterning the gate electrode layer to form patterned gate electrode layer 46. In one embodiment, patterned gate electrode layer 46 is a polysilicon gate electrode layer which forms polysilicon gates. Alternatively, patterned gate electrode layer 46 may include any gate material (including metals) or layers of gate materials to form the desired gate stacks for the devices being formed. Conventional processing may be used to form patterned gate electrode layer 46. Also, if a high-K dielectric is used for gate dielectric layers 42 and 44, portions of gate dielectric layers 42 and 44 not underlying patterned gate electrode layer 46 would be removed after formation of patterned gate electrode layer 46. (Note that the patterning is not visible in FIG. 11 because it occurs behind the page of FIG. 11 and out in front of the page of FIG. 11, but will be clearer in reference to the three-dimensional view of FIG. 12.)

Figure 12:
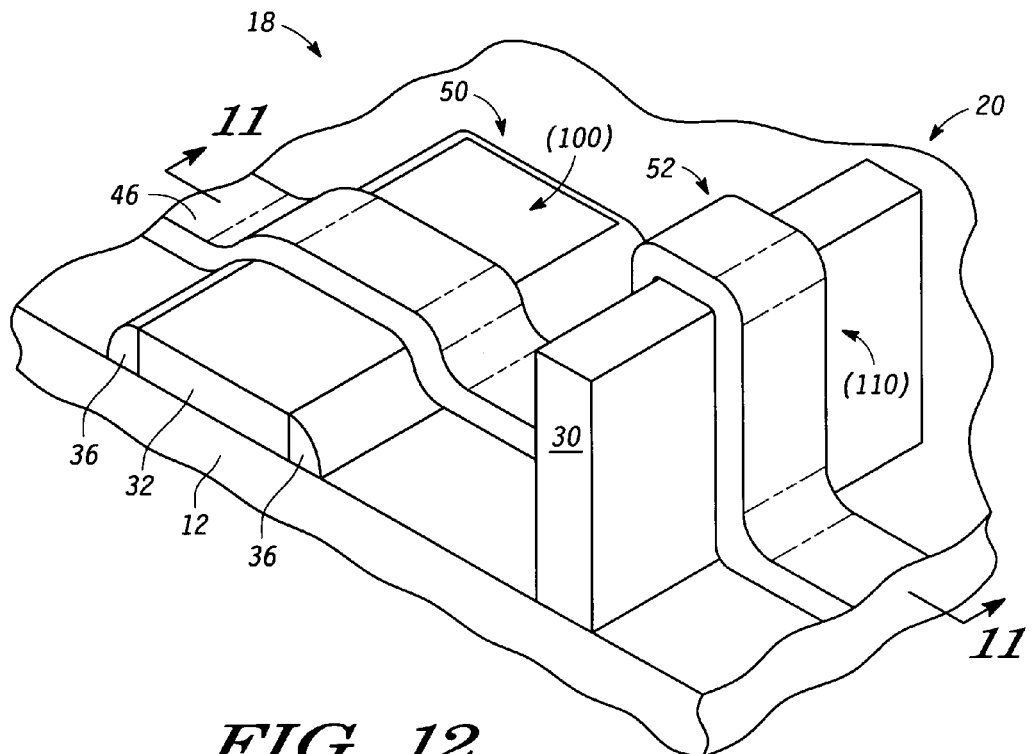
FIGS. 12 and 13 illustrate three-dimensional views of the devices of FIG. 11.

FIG. 12 illustrates a three-dimensional view of the devices of FIG. 11. Therefore, note that the cross section of FIG. 11 is taken across the line illustrated in FIG. 12, through patterned gate electrode layer 46. Note that the same numbers are used in FIG. 12 to indicate the same elements found in FIGS. 1-11. Note that gate dielectric layers 42 and 44 are not shown in FIG. 12 (so as not to complicate FIG. 12), but it would be located between patterned gate electrode layer 46 and active region 32 and between patterned gate electrode layer 46 and the vertical sidewalls of fin structure 30.

Note that a strained planar device 50 has been formed in region 18 and a partially strained or unstrained vertical device 52 (such as, for example, a FinFET device) has been formed in region 20. In the illustrated embodiment, planar device 50 is an n-type device and may therefore be referred to as n-type planar device 50, and vertical device 52 is a p-type vertical device and may therefore be referred to as p-type vertical device 52 or as p-type FinFET device 52. In one embodiment, the surface of active region 32 has a crystal orientation of (100) allowing for improved device performance for the n-type planar device and the vertical sidewall surfaces of fin structure 30 have a crystal orientation of (110) allowing for improved device performance for the p-type vertical device. In alternate embodiments, different crystal orientations may be used for active area 32 and fin structure 30 where the crystal orientation for active area 32 allows for improved n-type device performance and the crystal orientation of fin structure 30 allows for improved p-type device performance. Also, the use of a vertical p-type device integrated with a planar n-type device allows for each type of device to have its own crystal orientation such that the performance of each type of device may be improved without degrading performance of the other type of device. In an alternate embodiment, note that the planar devices may be p-type devices, while the vertical devices may be n-type devices, where the crystal orientations may be designed as needed to improve performance of each of the device types.

After formation of patterned gate electrode layer 46, source/drain extension regions may be formed by using, for example, angled implants on either side of patterned gate electrode layer 46, as known in the art. Alternatively, source/drain extension regions may not be formed. (Source/drain extension regions may also be referred to as current electrode extension regions.)

Figure 13:
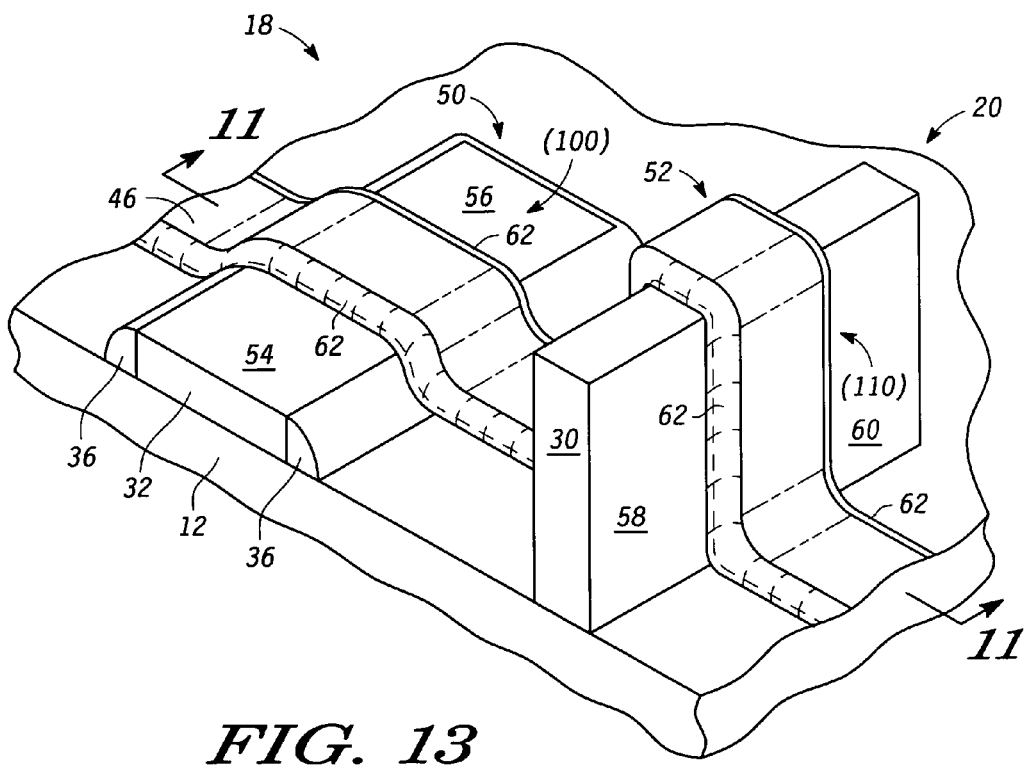

FIG. 13 illustrates the same three-dimensional view of devices 50 and 52 of FIG. 12, after formation of gate spacers 62 and source/drain regions 54, 56, 58, and 60. After the extension implants, if any, gate spacers 62 are formed along the sidewalls of patterned gate electrode layer 46, as shown in FIG. 13. Gate spacers 62 may be formed using conventional processes and materials (or combinations of materials), and provide isolation between the active area and the gate electrode of a device. For example, in device 50, gate spacer 62 provides isolation between active region 32 and patterned gate electrode layer 46, and in device 52, gate spacers 62 provides isolation between the active region (fin 30) and patterned gate electrode layer 46. Therefore, gate spacers 62 isolate the active area of a device from a gate portion of the device, unlike active region sidewall spacer 36, which isolates the active area of a device from other surrounding devices or areas rather than from a gate portion of the device.

After formation of gate spacers 62, deep source/drain implants may be formed into the top of active region 32 to form source/drain regions 54 and 56 of planar device 50, and into the vertical sidewalls of fin structure 30 to form source/drain regions 58 and 60 of vertical device 52. Conventional implants, dopants, concentrations, and processes may be used to form source/drain regions 54, 56, 58, and 60. Note that source/drain regions 54, 56, 58, and 60 may also be referred to as current electrode regions 54, 56, 58, and 60. Afterwards, conventional processing may be used to form substantially completed semiconductor devices.

Note that active region sidewall spacer 36 remains in the final device. That is, for example, once the formation of the semiconductor device (such as planar device 50) has been completed, the active region sidewall spacers 36 are still present in the semiconductor device. As described above, note that, in one embodiment, patterned gate electrode layer 46 is formed over at least a portion of active region sidewalls spacers 36, where active region sidewall spacer 36 remains after formation of patterned gate electrode layer 46 and is not subsequently removed.

Also, as illustrated in FIGS. 12 and 13, note that active region sidewall spacer 36 surrounds active region 32 (where active region 32 and fin structure 30 extend out of the front of the page). Therefore, in one embodiment, active region sidewall spacer 36 provides isolation between the active area of a device, such as active region 32, and at least a non-gate portion of the semiconductor structure. The semiconductor structure may refer to all or a portion of substrate 10 and the devices or features formed therein. For example, the semiconductor structure may refer to other devices, such as, for example, device 52 (or to any other devices formed on substrate 10) or other surrounding areas, where the non-gate portion of the semiconductor structure may include anything which is not a gate portion of a device (such as, for example, fin 30 of device 52). These non-gate portions may include, for example, neighboring devices or other surrounding areas or anything else that is not a gate portion of a device. In this manner, active region sidewall spacer 36 isolates active region 32 from other devices or surrounding areas. For example, active region sidewall spacer 36 provides isolation between active region 32 of device 50 and another device (such as device 52) or surrounding area, rather than providing isolation between active region 32 and the portion of patterned gate electrode layer 46 overlying active region 32. Note that gate spacers 62 instead provides the isolation between the portion of patterned gate electrode layer 46 overlying active region 32 and active region 32.

In one embodiment, after formation of patterned gate electrode layer 46, fin structure 30 may be compressively strained to further improve performance of p-type FinFET device 52. For example, in one embodiment, a highly compressive strained capping layer may be selectively deposited over the fin structures (such as fin structure 30) in region 20 which induces a compressive uniaxial stress in the fin structure of the FinFET devices. (Note that in this embodiment, the highly compressive strained capping layer is not formed in region 18 so as not to disturb the strain of the active regions in region 18.)

Therefore, it can be appreciated how a tensile strained semiconductor substrate may be used to form both n-type and p-type devices with improved performance (i.e. improved carrier mobility). By using the tensile strained semiconductor substrate to form active regions within a first region of the substrate, n-type devices may be formed using the tensile strain and crystal orientation that better suits n-type devices, resulting in better improved mobility. Also, by selectively relaxing or reducing tensile stress in portions of the tensile strained semiconductor substrate, p-type devices may be formed without degrading their performance. That is, at least a portion of the tensile strained semiconductor substrate in a second region of the substrate may be relaxed and used to form a vertical p-type device (such as a FinFET device or vertical double gate device) using a relaxed (or even compressive strained) fin structure.

Furthermore, the integration of vertical and planar devices allows for the use of crystal orientations which improve performance of devices having different conductivity types. For example, the formation of a vertical p-type device (such as a FinFET or a vertical double gate device) allows for the use of a crystal orientation that better suits p-type devices, while the formation of a planar n-type device allows for the use of a crystal orientation that better suits n-type devices, resulting in improved carrier mobility for both types of devices. Alternatively, depending on the crystal orientation used, vertical n-type devices may be integrated with planar p-type devices.

Although the embodiments described in reference to FIGS. 1-12 were discussed in reference to strained semiconductor layer 14 having an in-plane biaxial tensile stress, the above descriptions also apply to semiconductor layer 14 having other stresses, such as, for example, a biaxial compressive stress, uniaxial tensile stress, or uniaxial compressive stresses. For example, horizontal devices may be formed using the uniaxial or biaxial tensile or compressive strained semiconductor substrate, while other portions of the uniaxial or biaxial tensile or compressive strained semiconductor substrate may be relaxed to form vertical devices. That is, the thickening of the semiconductor substrate in a region to form vertical devices and the subsequent thermal treatment in this region (both discussed above in reference to FIG. 3) may also be used to remove or reduce the strain of a uniaxial compressive stressed semiconductor substrate, a uniaxial tensile stressed semiconductor substrate, or a uniaxial compressive strained semiconductor substrate.

Also, it can be appreciated how the use of active region sidewall spacers, such as active region sidewall spacers 36, may provide isolation between an active region of a device and other devices (other planer device, other vertical devices, or a combination of other devices), surrounding areas, or other surrounding non-gate portions. In this manner, active regions formed from a substrate can be better isolated from surrounding devices or areas. For example, the use of active region sidewall spacers may allow for improved integration of different types of devices, such as, for example, planar and vertical devices.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for forming a semiconductor structure, the method comprising:
    providing a substrate, said substrate comprising a strained semiconductor layer overlying an insulating layer;
    providing a first device region for forming a first plurality of devices having a first conductivity type;
    providing a second device region for forming a second plurality of devices having a second conductivity type, wherein the second conductivity type is different than the first conductivity type;
    wherein the first plurality of devices comprise planar devices and the second plurality of devices comprise vertical devices;
    thickening the strained semiconductor layer in the second device region to form a thickened strained semiconductor layer so that the thickened strained semiconductor layer in the second device region has less strain than the strained semiconductor layer in the first device region;
    wherein said step of thickening comprises: epitaxially growing a same semiconductor material as the strained semiconductor layer directly on the strained semiconductor layer to form the thickened semiconductor layer;
    wherein said step of thickening comprises: forming a masking layer overlying the first device region, and performing selective epitaxial growth to thicken the strained semiconductor layer in the second device region and not in the first device region;
    wherein a thickness of a portion of the strained semiconductor layer which is epitaxially grown is thicker than a thickness of the masking layer; and
    forming the first plurality of devices in the first device region and the second plurality of devices in the second device region, wherein source/drain regions of the first plurality of devices are formed within the strained semiconductor layer and source/drain regions of the second plurality of devices are formed within the thickened strained semiconductor layer, wherein said step of forming the second plurality of devices in the second device region comprises:
        after said step of thickening the strained semiconductor layer in the second device region, removing portions of the thickened strained semiconductor layer to expose the insulating layer; and
        after said step of removing the portions of the thickened strained semiconductor layer, forming a gate dielectric layer adjacent sidewalls of the thickened strained semiconductor layer.

2. A method as in claim 1, further comprising:
    performing no thickening of the strained semiconductor layer in the first device region.

3. A method as in claim 1, wherein said substrate comprises an SSOI (strained semiconductor on insulator) substrate.

4. A method as in claim 1, wherein the first conductivity type is n-type and the second conductivity type is p-type.

5. A method as in claim 1, wherein a crystal orientation of the strained semiconductor layer for the planar devices comprises (100), and wherein a crystal orientation for the strained semiconductor for the vertical devices comprises (110).

6. A method as in claim 1, wherein the vertical devices comprise FinFET devices.

7. A method as in claim 1, wherein the selective epitaxial growth is performed at a temperature in a range of approximately 400-950 degrees Celsius.

8. A method as in claim 1, further comprising:
    after said step of performing selective epitaxial growth, thermally treating the semiconductor structure at a temperature in a range of approximately 400-1200 degrees Celsius.

9. A method as in claim 1, further comprising:
    after said step of performing selective epitaxial growth, thermally treating the semiconductor structure in an ambient comprising a chemistry selected from the group consisting of hydrogen and hydrochloric acid.

10. A method as in claim 1, wherein a tensile stress of the strained semiconductor layer in the first device region is greater than 1.0 Giga Pascals.

11. A method as in claim 1, wherein a tensile stress of the strained semiconductor layer in the second device region is approximately zero Giga Pascals.

12. A method as in claim 1, wherein the first plurality of devices comprise n-channel devices and the second plurality of devices comprise p-channel devices.

13. A method as in claim 1, further comprising:
    forming an insulating layer overlying at least an active area of the first device region;
    anisotropically etching the insulating layer; and
    after anisotropically etching the insulating layer, depositing a gate electrode material overlying at least a portion of the insulating layer.

14. A method for forming a semiconductor structure, the method comprising:
    providing a substrate, said substrate comprising a strained semiconductor layer overlying an insulating layer;
    providing a first device region wherein providing comprises forming a first plurality of devices having a first conductivity type;
    providing a second device region wherein providing comprises forming a second plurality of devices having a second conductivity type, wherein the second conductivity type is different than the first conductivity type;
    wherein the first plurality of devices comprise planar devices and the second plurality of devices comprise vertical devices;
    epitaxially growing the strained semiconductor layer in the second device region to form a thickened semiconductor layer when forming the second plurality of devices without epitaxially growing the strained semiconductor layer in the first device region when forming the first plurality of devices, wherein forming the second plurality of devices comprises forming source/drain regions of the second plurality of devices within the thickened semiconductor layer in the second device region and forming the first plurality of devices comprises forming source/drain regions of the first plurality of devices within the strained semiconductor layer in the first device region, wherein forming the second plurality of devices in the second region comprises:
- after said step of epitaxially growing the strained semiconductor layer in the second device region, removing portions of the thickened strained semiconductor layer to expose the insulating layer; and
- after said step of removing the portions of the thickened strained semiconductor layer, forming a gate dielectric layer adjacent sidewalls of the thickened strained semiconductor layer;

wherein said step of epitaxially growing comprises: forming a masking layer overlying the first device region, and performing selective epitaxial growth to thicken the strained semiconductor layer in the second device region and not in the first device region; and wherein a thickness of a portion of the strained semiconductor layer which is epitaxially grown is thicker than a thickness of the masking layer.

15. A method as in claim 14, wherein the strained semiconductor layer in the second device region has less tensile stress than the strained semiconductor layer in the first device region.

16. A method for forming a semiconductor structure, the method comprising:
- providing a substrate, said substrate comprising a strained semiconductor layer overlying an insulating layer;
- providing a first device region wherein providing comprises forming a first plurality of devices having a first conductivity type;
- providing a second device region wherein providing comprises forming a second plurality of devices having a second conductivity type, wherein the second conductivity type is different than the first conductivity type;
- wherein the first plurality of devices comprise planar devices and the second plurality of devices comprise vertical devices;
- epitaxially growing the strained semiconductor layer in the second device region to form a thickened semiconductor layer when forming the second plurality of devices, wherein forming the second plurality of devices comprises forming source/drain regions of the second plurality of devices within the thickened semiconductor layer in the second device region and forming the first plurality of devices comprises forming source/drain regions of the first plurality of devices within the strained semiconductor layer in the first device region;
- wherein said step of epitaxially growing comprises: forming a masking layer overlying the first device region, and performing selective epitaxial growth to thicken the strained semiconductor layer in the second device region and not in the first device region;
- wherein a thickness of a portion of the strained semiconductor layer which is epitaxially grown is thicker than a thickness of the masking layer;
- forming an insulating layer overlying at least an active area of the first device region;
- anisotropically etching the insulating layer; and
- depositing a gate electrode material overlying at least a portion of the insulating layer after anisotropically etching the insulating layer.

17. A method as in claim 14, wherein said step of epitaxially growing the strained semiconductor layer in the second device region comprises:
- epitaxially growing a same semiconductor material as the strained semiconductor layer directly on the strained semiconductor layer to form the thickened semiconductor layer.

\* \* \* \* \*